(12) United States Patent
Ahrens et al.

(10) Patent No.: US 7,763,520 B2
(45) Date of Patent: Jul. 27, 2010

(54) CAPACITOR DEVICE WITH A LAYER STRUCTURE DISPOSED IN A MEANDER-SHAPED MANNER

(75) Inventors: Carsten Ahrens, Pettendorf (DE); Raimund Foerg, Munich (DE); Klaus Koller, Germering (DE); Kai-Olaf Subke, Grafing (DE)

(73) Assignee: Infineon Technologies AG, Neubiberg (DE)

( * ) Notice: Subject to any disclaimer, the term of this patent is extended or adjusted under 35 U.S.C. 154(b) by 272 days.

(21) Appl. No.: 11/833,074

(22) Filed: Aug. 2, 2007

(65) Prior Publication Data

US 2008/0029799 A1    Feb. 7, 2008

(30) Foreign Application Priority Data

Aug. 2, 2006    (DE) .................. 10 2006 036 076

(51) Int. Cl.
*H01L 21/20*    (2006.01)
(52) U.S. Cl. .................. 438/387; 438/386; 438/389; 257/E29.346

(58) Field of Classification Search .................. 257/301, 257/303, 308, 309, 532, E21.651, E27.092, 257/E29.346; 438/243, 244, 386, 387, 389, 438/296
See application file for complete search history.

(56) References Cited

U.S. PATENT DOCUMENTS

| 5,677,225 | A  | * | 10/1997 | Park | .................. | 438/243 |
| 6,077,739 | A  | * | 6/2000 | Chang | .................. | 438/243 |
| 6,319,787 | B1 | * | 11/2001 | Enders et al. | .................. | 438/386 |
| 2005/0116275 | A1 | | 6/2005 | Lin et al. | | |

FOREIGN PATENT DOCUMENTS

JP    02153560    6/1990

\* cited by examiner

*Primary Examiner*—Matthew C Landau
*Assistant Examiner*—Lindsay Wickers
(74) *Attorney, Agent, or Firm*—Dicke, Billig & Czaja, PLLC (57) ABSTRACT

A capacitor device includes a substrate, a first conductive structure, a second conductive structure, a dielectric layer structure, and a recess in the substrate. The first and second conductive structures are disposed on opposite sides of the dielectric layer structure, and the dielectric layer structure extends in a meander-shaped manner in a cross-section through the recess.

5 Claims, 8 Drawing Sheets

CAPACITOR DEVICE WITH A LAYER STRUCTURE DISPOSED IN A MEANDER-SHAPED MANNER

CROSS-REFERENCE TO RELATED APPLICATIONS

This Utility Patent Application claims priority to German Patent Application No. DE 10 2006 036 076.1, filed on Aug. 2, 2006, which is incorporated herein by reference.

BACKGROUND

The present invention relates to a capacitor device with a layer structure disposed in a meander-shaped manner, and in particular to a self-adjusted folded trench capacitor for increasing an area capacitance compared to a simple trench capacitor.

A capacitor (or capacitance) includes at least two conductive layers (capacitor electrodes) being electrically insulated by a dielectric layer along a layer area. Capacitors are used in the following technologies: BiPOLAR, BiCMOS, CMOS, DRAM. For electronic circuits which need great capacities, common plate capacitors (MIS and/or MIM capacities; MIS=metal isolator semiconductor; MIM=metal isolator metal) can be used.

The capacitor includes a capacitance which, for the given materials and layer thicknesses, is dependent on the layer area. Thus, a reduction of the size of the capacitor leads to a decrease of its capacitance. In the course of a further proceeding miniaturization, it is important to provide capacitors which include an acceptable capacitance even on the smallest space. An increase of the area capacitance of passive capacitors is important to further develop available technologies.

SUMMARY

One embodiment includes a capacitor device having a substrate, a first conductive structure, a second conductive structure, a dielectric layer structure and a recess in the substrate, wherein the first and second conductive structures are disposed on opposite sides of the dielectric layer structure and the dielectric layer structure extends in a meander-shaped manner in a cross-section through the recess.

One embodiment includes a capacitor device having a substrate, a trench in the substrate, wherein the substrate is doped on a trench bottom and a trench wall to form a doped region, at least one conductive element protruding from the trench bottom, wherein the doped region and the conductive elements form a first electrode structure. Additionally, the capacitor device includes a second electrode structure and a dielectric layer structure extending in a meander-shaped manner in the trench, wherein the first and second electrode structures are disposed on opposite sides of the dielectric layer.

One embodiment includes a method for manufacturing a capacitor device in a recess in a substrate, having a step of forming a first conductive structure and a dielectric layer structure in the recess such that the first conductive structure extends from a bottom to an opening of the recess and the dielectric layer structure is disposed on the first conductive structure and extends in a meander-shaped manner in a cross-section of the recess, and a step of forming a second conductive structure on the dielectric layer structure such that the dielectric layer structure electrically insulates the first and second conductive structures.

One embodiment includes a method for manufacturing a capacitor device in a trench in a substrate, having a step of forming a conductive structure along a trench bottom and a trench wall, and at least one-time performing of the following sequence of steps. The sequence of steps includes a depositing of dielectric in the trench, a depositing of a conductive material in the trench, a removing of the conductive material on the trench bottom and a surface by anisotropic etching, a depositing of dielectric, a removing of the dielectric on the trench bottom and the surface by anisotropic etching, a depositing of conductive material in the trench, a removing of the conductive material on the trench bottom by anisotropic etching, a depositing of dielectric in the trench, a depositing of conductive material in the trench and electrically connecting the conductive material on a side of the dielectric facing away from the substrate to a second electrode structure, wherein the conductive material in the trench on a side of the dielectric facing the substrate and the conductive structure along the trench bottom and the trench wall form the first electrode structure.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Before embodiments of the present invention are explained in detail in what follows on the basis of the drawings, it is noted that same elements in the figures are provided with the same or like reference numerals, and that a repeat description of these elements is omitted.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

To achieve high area capacities, trench capacitors are also used when needed. Herein, deep trenches or holes are etched into a substrate (e.g. silicon). The trenches are then filled with a dielectric and/or a dielectric layer and subsequently with a conductive electrode. By an integration of the capacitor in depth, the achieved capacities can be increased by a factor of 10 to 20 compared to MIS/MIM capacitors.

The trench or the hole has a width which is limited by used lithography, and a current lower limit is approximately 0.35 µm. The dielectric between the trench in the substrate and the electrode is limited by a thickness of the dielectric layer and/or a permissible leakage current or breakdown strength.

According to an embodiment, a further increase of the area capacitance is achieved by a multiple folding of trench capacitors. This means that the dielectric layer does not only fill the trench but extends within the trench and/or in a cross-section of the trench multiply folded or in a meander-shaped manner.

The trench or the hole in the substrate is formed for example via a lithographic step or photo technique, and includes a bottom and at least a wall extending advantageously as perpendicularly as possible from the bottom to a surface of the substrate. Subsequently, in several steps, conductive and dielectric layers are deposited and, for example, anisotropically etched so that the conductive and/or dielectric layers are removed only from the bottom or from the surface, but not from the wall.

By an appropriate sequence of the process steps which will be explained in further detail below by means of an example, an alternating layer sequence of conductive and dielectric material can therefore be created from the wall of the trench or the hole having layer thicknesses that are defined by the depositing of the conductive and/or dielectric material, and are not aligned via a photo process.

By an appropriate process control, the dielectric layers are bound together such that a single dielectric layer insulates two electrically conductive structures. Thereby, the resulting dielectric layer extends in a meander-shaped manner or folded in the trench or the hole, and the two electrically insulated conductive structures form the two capacitor electrodes. Depending on a minimal layer thickness contingent on technology which, for example, secures the breakdown strength, the processing can be repeated step by step until a given trench width is filled.

An electric contacting of the two capacitor electrodes is accomplished, for example, via a buried conductor (buried layer) and a top electrode from poly-silicon, for example. The dielectric layer between the capacitor electrodes can, for example, be created by means of a CVD method (CVD=chemical vapor deposition) and can include oxide, silicon nitride or ONO (oxide-nitride-oxide) as possible materials.

In other words, the following embodiments describe a capacitor device with a substrate with a recess, a first conductive structure in the recess, a second conductive structure in the recess, and a dielectric layer structure, wherein the first and the second conductive structures are disposed on opposite sides of the dielectric layer structure and the dielectric layer structure extends in a cross-section through the recess in a meander-shaped manner. In yet other words, they describe a capacitor device with a substrate with a trench, wherein the substrate is doped on a trench bottom and a trench wall so as to form a doped region, wherein at least one conductive element protruding from the trench bottom, a second electrode structure in the trench and a dielectric layer structure extending in the trench in a meander-shaped manner are provided, wherein the doped region and the at least one conductive element form a first electrode structure and the first and second electrode structures are disposed on opposite sides of the dielectric layer.

Embodiments of the present invention include a series of advantages compared to a common process control. Thus, the process control is self-adjusting (does not need additional photo planes) and can thus be realized even without high-resolution exposure (<i-line exposure).

The process control includes two photo planes with a resolution of, for example, 1 µm (i.e. g-line exposure). After, for example, a selected silicon trench etching, a process sequence occurs in a self-adjusting manner. This means that subsequent processes are adjusted to the preceding processes without a structuring. With same geometry as in conventional trench capacitors, an increase of for example the area capacitance can thus be achieved by a factor of 4. By the self-adjusting of single processes a multiplication of the current area capacitance can thus be achieved at low costs.

Figure 1:
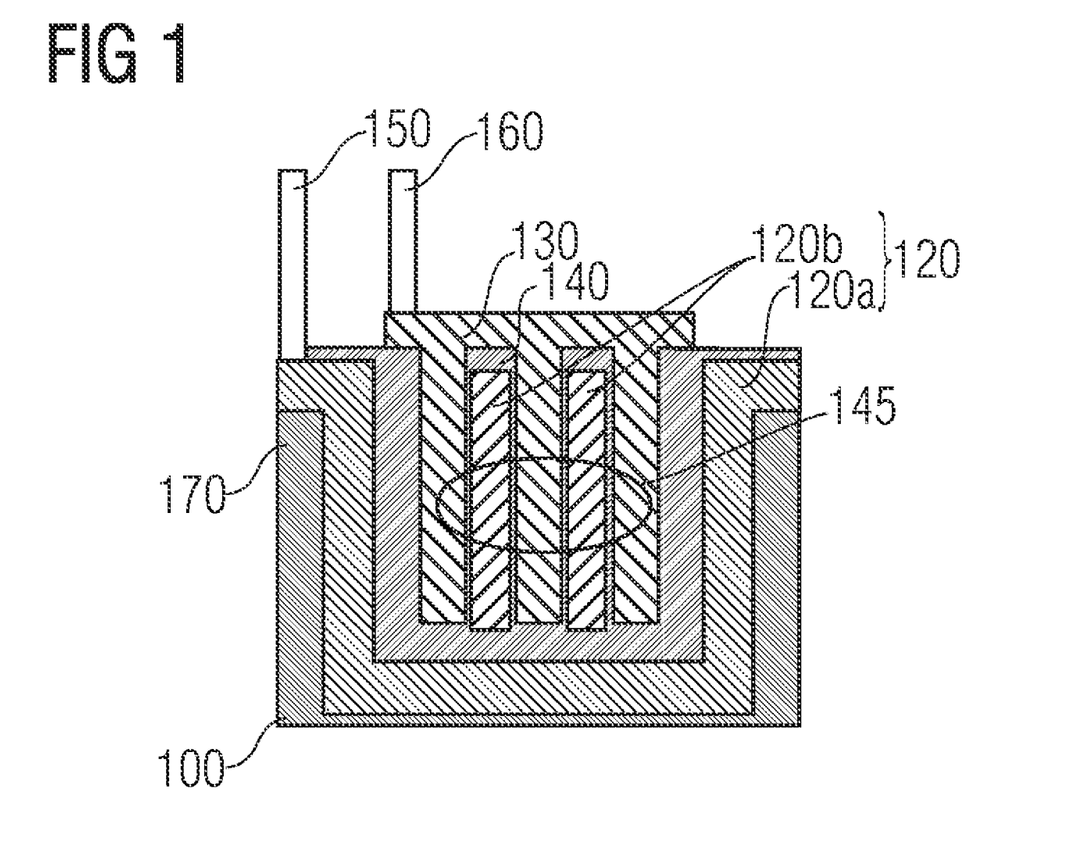
FIG. 1 is a cross-sectional view through a trench capacitance with double multistack architecture.

FIG. 1 illustrates a cross-section through a trench capacitor with double multistack architecture according to an embodiment of the present invention.

FIG. 1 illustrates a substrate 100 with a doping layering 120a, which at least partially extends along a recess 145 and along a surface 170. The doping layer 120a together with a conductive layer 120b form a first conductive structure 120 being insulated from a second conductive structure 130 by a dielectric layer structure 140. The first conductive structure 120 is in electric contact to a first terminal contact 150 via the doping layer 120a, and the second conductive structure 130 is electrically contacted with a second terminal contact 160.

The recess 145 in the substrate 100 can, for example, be created by an etching process, e.g. in form of a hole or a trench, and the doping layer 120a is doped electrically conductive by means of an appropriate doping method. A possible material for the substrate 100 is for example silicon, and as a doping method for creating the doping layer 120a for example phosphor glass out-diffusion can be considered. As a function of the temp budget, the doping layer 120a, for instance, has a layer thickness in a range from 150 nm to 400 nm or, more advantageously, in the range of 250 nm to 300 nm.

FIGS. 2a-2m illustrate, by way of example, a possible schematic process sequence for manufacturing the trench capacitor of FIG. 1.

Figure 2A:
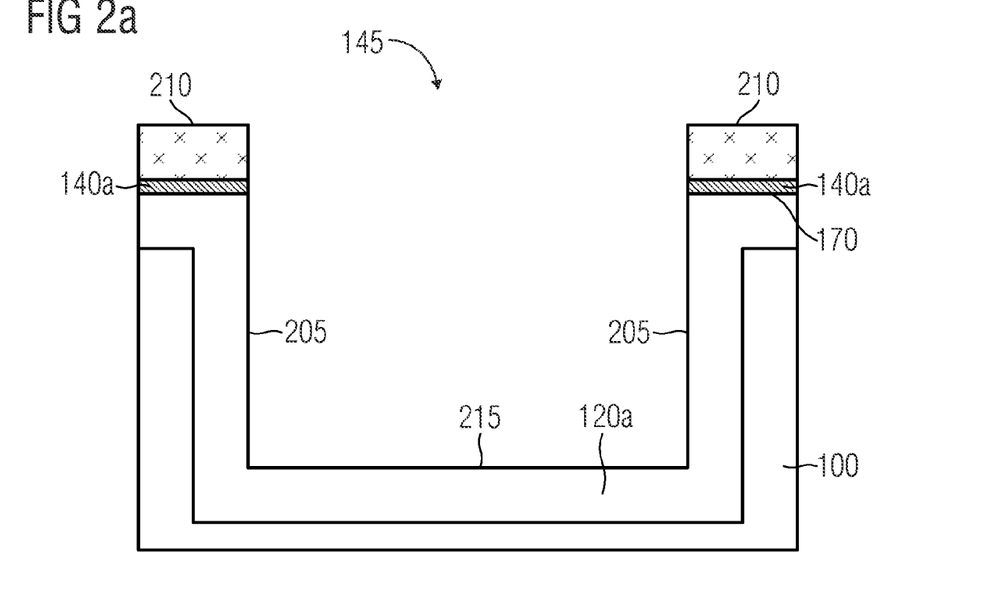
FIG. 2a-m illustrates a schematic process flow for manufacturing the trench capacitance according to an embodiment of the present invention.

FIG. 2a illustrates the recess 145 in the substrate 100 with the doping layer 120a, a first part of the dielectric layer 140a and a first protective layer 210. The doping layer 120a extends along a bottom 215 and at least partially along a wall 205 as well as the surface 170 of the recess 145. The structure illustrated in FIG. 2a can for example be created by depositing the first part of the dielectric layer 140a and the first protective layer 210 on the substrate 100. By using an appropriate mask (for example a hard mask), the first protective layer 210, the first part of the dielectric layer 130a and the substrate 100 can be etched for example in an etching process, and therefore the recess 145 can be created. This etching process can include several etching steps that are each sensitive to used layer materials.

Subsequently, the bottom 215 and the wall 205 of the recess 145 are at least partially doped. Thereby, the recess has a width between 0.9 to 1.1 µm, for example. To achieve a maximum area capacitance, the recess 145 can have a technologically feasible maximum depth. Depths of for example up to 20 µm would be possible. For instance, the first part of the dielectric layer 140a includes a nitride dielectric and the first protective layer 210 an oxide.

In the following steps, all layers of the side facing away from the substrate 100 are deposited on and/or removed from the recess 145, even though this is not explicitly noted. For reasons of simplicity, in most cases only the reference numerals that are of importance in each step are given. A complete designation of all layers is given in FIG. 2m, for example.

Additionally, same reference numerals are used for layers and/or structures that are disposed on both sides in the cross-sectional view, in as far as they have a same function and/or are made out of a single layer by structuring (e.g. an etching process). Thus, the wall 205 of the recess 145 refers to both sides in the cross-sectional view of FIG. 1 and also in the following cross-sectional views. Additionally, it should be noted that in the recess 145 which, in a top view, for example, has a circular form, both sides are equivalent in the cross-sectional views. For example, a circular recess 145 only has one lateral edge. In the same sense, parts of layers that appear as insulated in the following cross-sectional views can relate to one and the same layer, and consequently receive the same reference numeral.

Figure 2B:
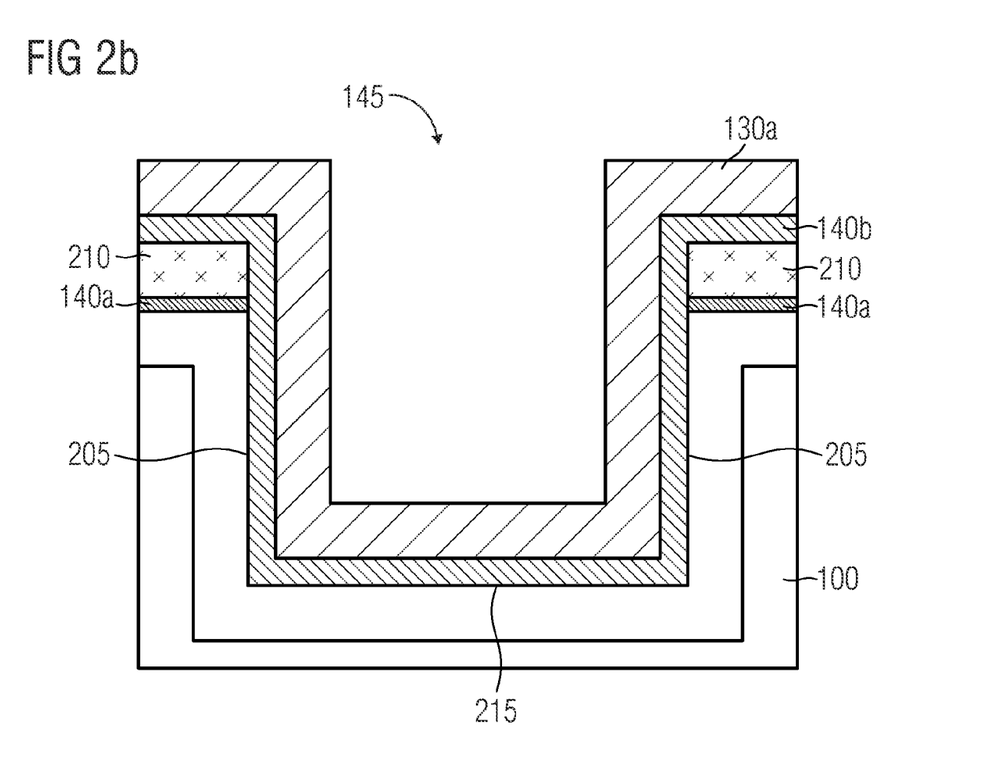

As illustrated in FIG. 2b, in a following step a second part of the dielectric layer 140b is applied to the structure illustrated in FIG. 2a and subsequently a first part of the second conductive structure 130a is deposited on it. In this connection it is important that the second part of the dielectric layer 140b electrically insulates the doping layer 120a and the first part of the second conductive structure 130a. The second part of the dielectric layer 140b can include for example a nitride dielectric in a layer thickness of approximately 30 nm. The first part of the second conductive structure 130a includes, for example, ISDP (ISDP=in-situ doped poly-silicon) in a layer thickness of approximately 150 nm.

Figure 2C:
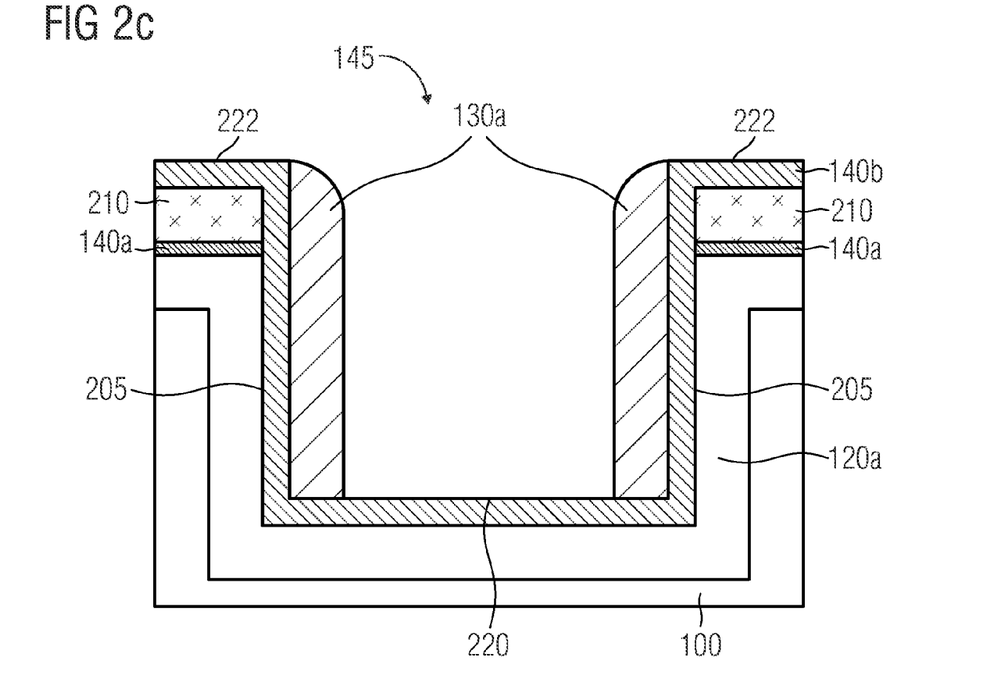

As illustrated in FIG. 2c, the first part of the second conductive structure 130a is removed from the side facing away from the substrate 100 so that a surface 222 as well as a bottom 220 of the second part of the dielectric layer 140b are exposed. Here, however, the first part of the second conductive structure 130a remains on the wall 205 as completely as possible. For example, this can be done by an anisotropic etching process, wherein the second part of the dielectric layer 140b acts as a stopping layer.

Figure 2D:
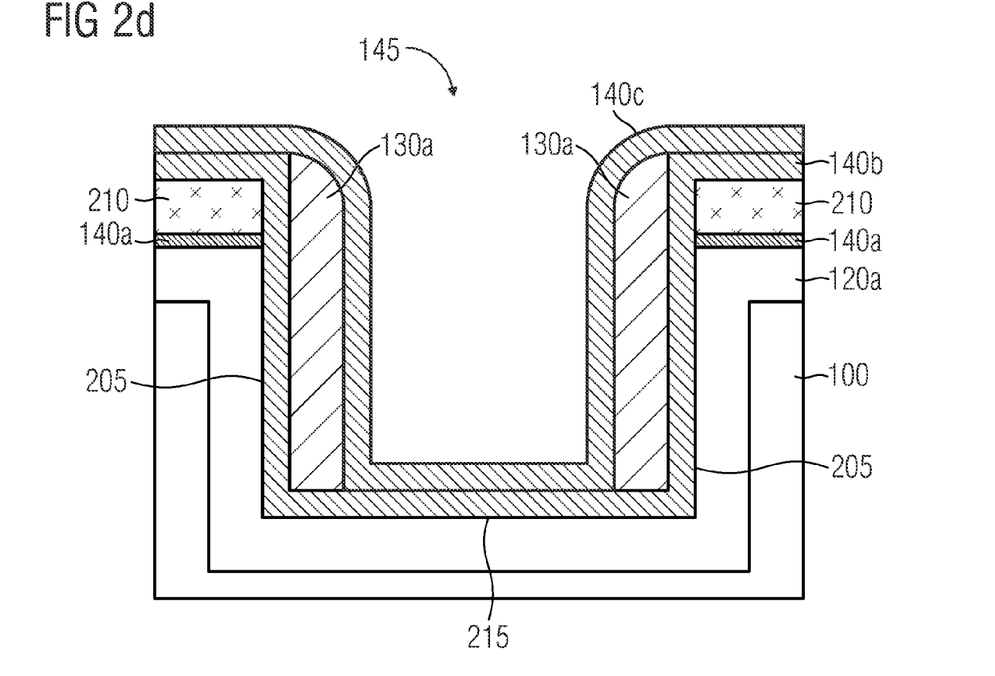

Subsequently, as illustrated in FIG. 2d, a third part of the dielectric layer 140c is deposited. The third part of the dielectric layer 140c can include for example nitride dielectric in a layer thickness of approximately 30 nm.

Figure 2E:
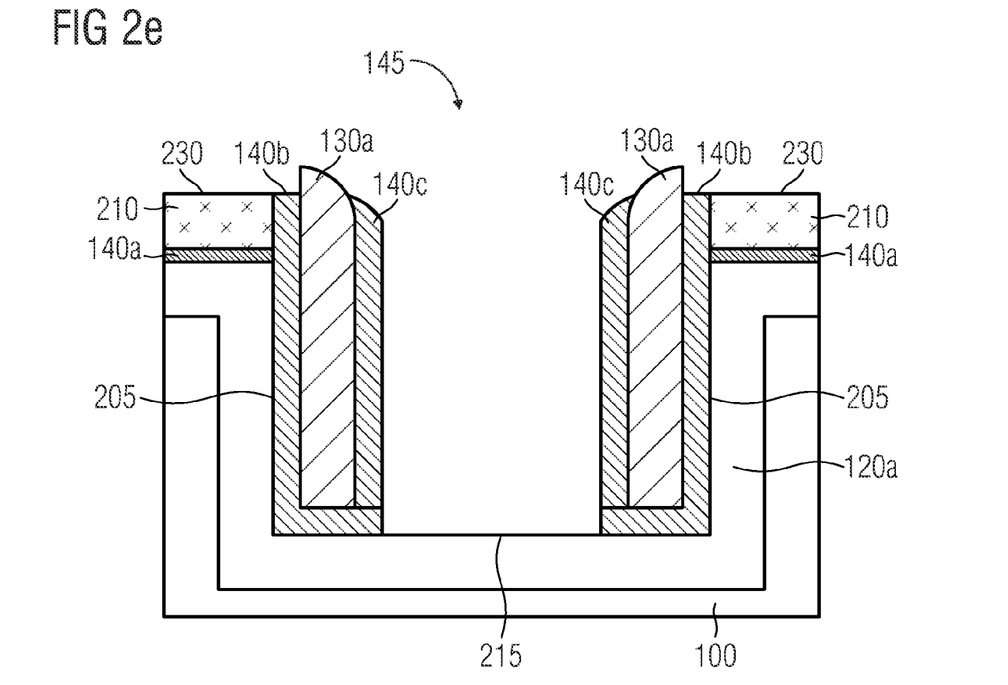

As illustrated in FIG. 2e, now the third part of the dielectric layer 140c is removed from the side facing away from the substrate so that a surface 230 of the first protective layer 210, the bottom 215 as well as the side of the first part of the second conductive structure 130a facing away from the bottom 215 are exposed. As was previously the case, substantially the third part of the dielectric layer 140c in direction to the wall 205 is preserved here and is not removed. This can again be done again for example by an anisotropic etching process, wherein the etching process is selected so that it has a sensitive effect on a layer material of the third part of the dielectric layer 140c, and, furthermore, the first protective layer 210 acts as a stopping layer. Thereby, approximately 30 nm of the third part of the dielectric layer 140c is removed, for example.

Figure 2F:
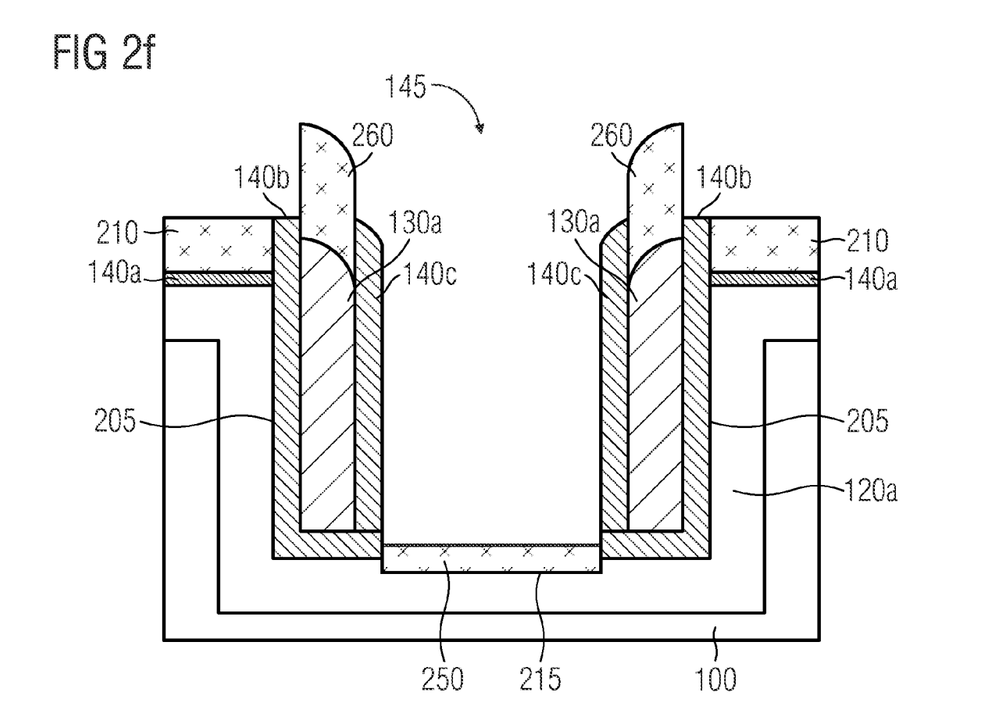

As illustrated in FIG. 2f, now the second protective layer 250 along the bottom 215 and a third protective layer 260 along the exposed side of the first part of the second conductive layer 130a are created. This can be done for example by an oxidation process so that the second protective layer 250 includes a layer thickness of for example 70 nm and the third protective layer 260 a layer thickness of for example 150 nm.

Figure 2G:
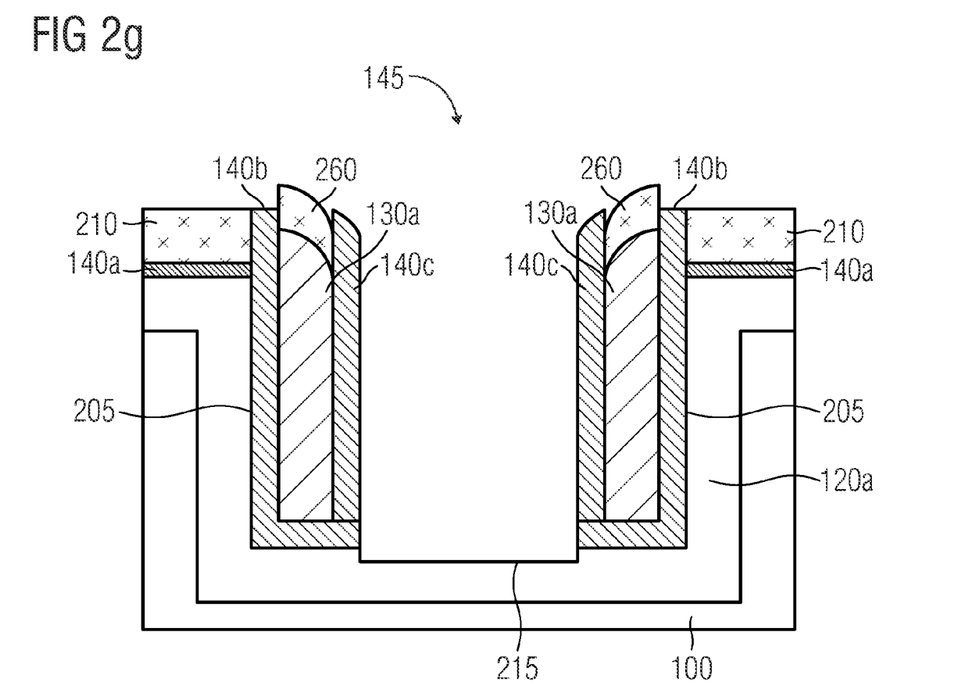

In a further step illustrated in FIG. 2g, the second protective layer 250 is removed and the layer thickness of the third protective layer 260 is decrease. This can be done for example by introducing the structure in hydrogen fluoride (HF dip) so that the third protective layer 260 has a reduced thickness of for example 50 nm, but the second protective layer 250 is substantially removed.

Figure 2H:
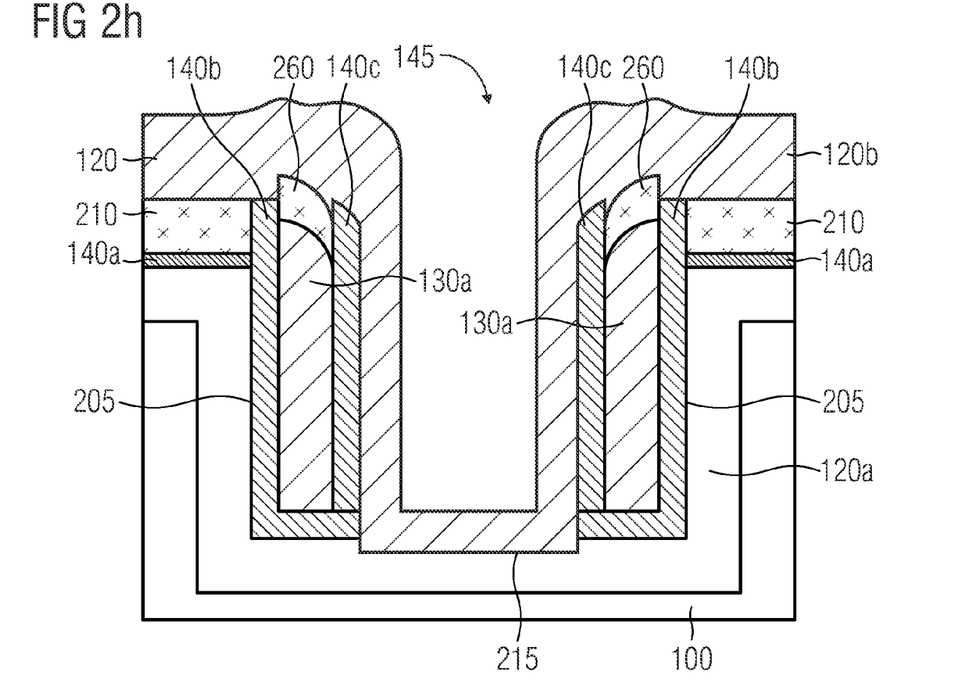

As illustrated in FIG. 2h, now a conductive layer 120b is deposited on the side of the structure of FIG. 2g facing away from the substrate 100. The conductive layer 120b includes for example ISDP in a layer thickness of approximately 200 nm. During processing it is important that the conductive layer 120b in direction to the wall 205 is electrically insulated from the first part of the second conductive structure 130a by the third part of the dielectric layer 140c.

Figure 2I:
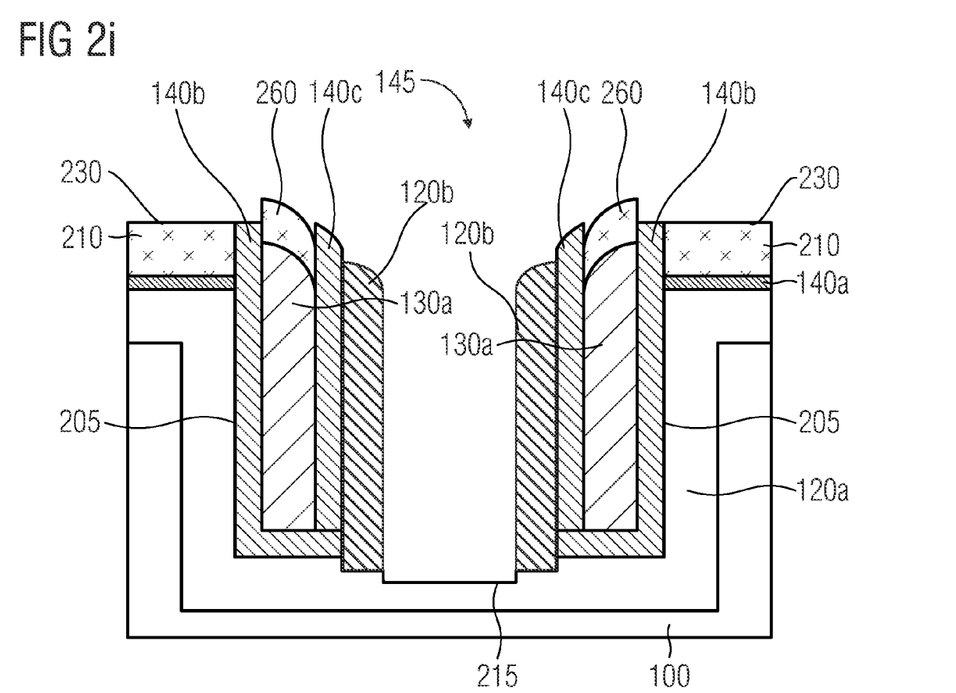

As illustrated in FIG. 2i, the conductive layer 120b is removed from the side facing away from the substrate so that the surface 230 and the bottom 215 of the recess 145 are exposed. Furthermore, the portions of the second part of the dielectric layer 140b, the third part of the dielectric layer 140c and the third protective layer 260 each facing away from the substrate 100 are exposed. In direction to the wall 205, however, the conductive layer 120b is preserved as completely as possible. This step can again be done for example by an anisotropic etching process that has a sensitive effect on the conductive layer 120b (i.e. ISDP, for instance) and that etches 200 nm, for example. In the course of this, for example the first and the third protective layers 210 and 260, the second and third parts of the dielectric layers 140b and 140c as well as the doping layer 120a at the bottom 215 act as stopping layers. In a further embodiment, the etching process can partially etch into the doping layer 120a (over-etched).

Figure 2J:
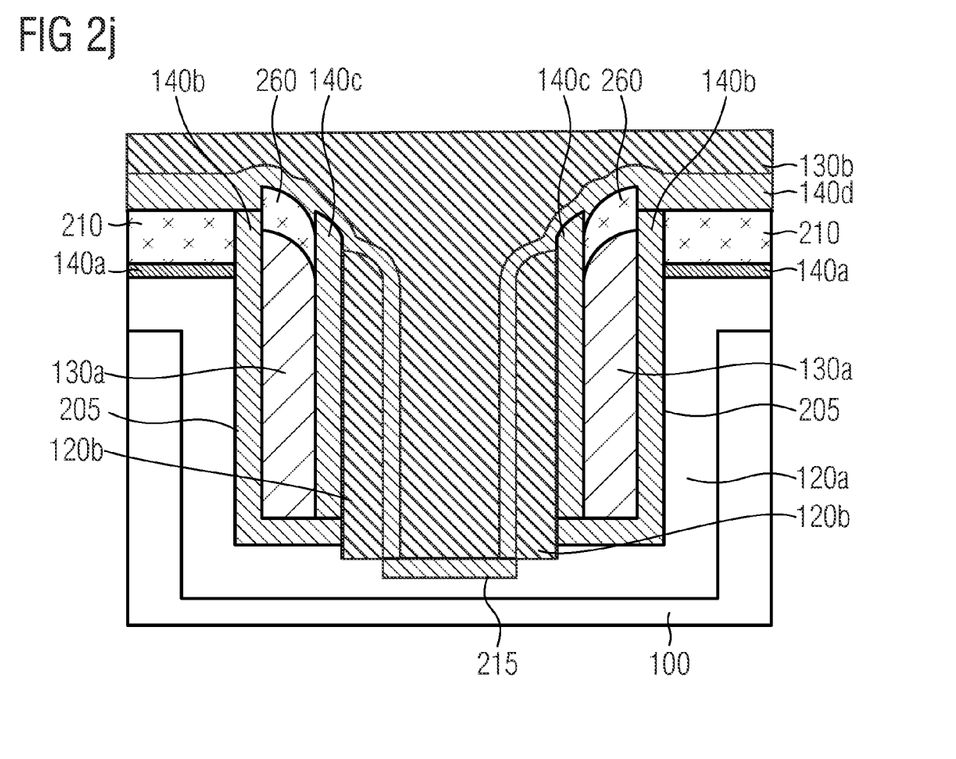

As illustrated in FIG. 2j, a fourth part of the dielectric layer 140d is applied to the structure illustrated in FIG. 2i and subsequently a second part of the second conductive structure 130b. The fourth part of the dielectric layer 140d can again include for example a nitride dielectric in a layer thickness of approximately 30 nm, and the second part of the second conductive structure 130b can include, for example, ISDP in a layer thickness of approximately 400 nm.

Figure 2K:
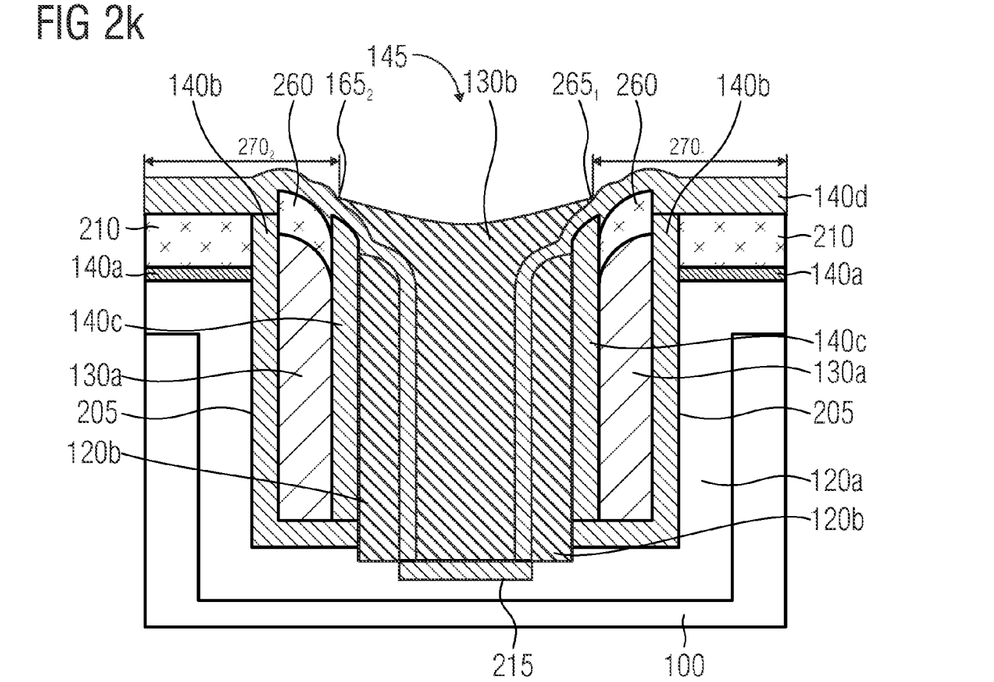

As illustrated in FIG. 2k, the second part of the second conductive structure 130b is removed from the side facing away from the substrate 100 in as far as the fourth part of the dielectric layer 140d in the cross-sectional view in FIG. 2k is exposed to a first part $270_1$ and to a second part $270_2$. The second part of the second conductive structure 130b then remains substantially only within the recess 145, and extends between a first limiting point $265_1$ and a second limiting point $265_2$ in the cross-sectional view in FIG. 2k. The removing of the second part of the second conductive structure 130b is advantageously performed such that along the exposed part 270 the conductive layer 120b of the side facing away from the substrate is protected by the fourth part of the dielectric layer 140d such that a following etching step does not expose the conductive layer 120b.

Figure 2L:
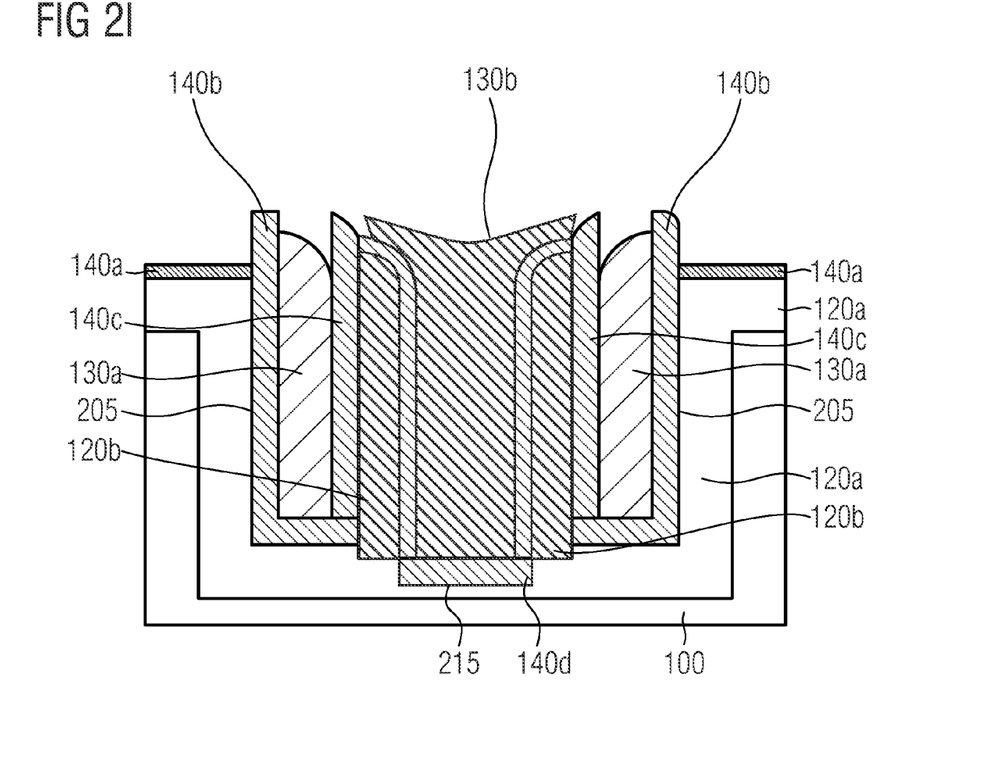

As illustrated in FIG. 2l, initially the fourth part of the dielectric layer 140d, and subsequently the first protective layer 210 and the third protective layer 260 are removed from the side facing away from the substrate 100 so that the first part of the dielectric layer 140a, the second part of the dielectric layer 140b, the first part of the second conductive structure 130a, and the third part of the dielectric layer 140c of the side facing away from the substrate are exposed. This can be done in two steps, for example. First, for example an anisotropic etching process can be performed that has a sensitive effect on the layer material of the fourth part of the dielectric layer 140d, and also stops on the first protective layer 210 as well as on the third protective layer 260, and, furthermore, does not remove the second part of the second conductive structure 130b. In a second process the first protective layer 210 and the third protective layer 260 can be removed, for example by an HF dip. This is possible, for example, when the first protective layer 210 and the third protective layer 260 include an oxide.

Figure 2M:
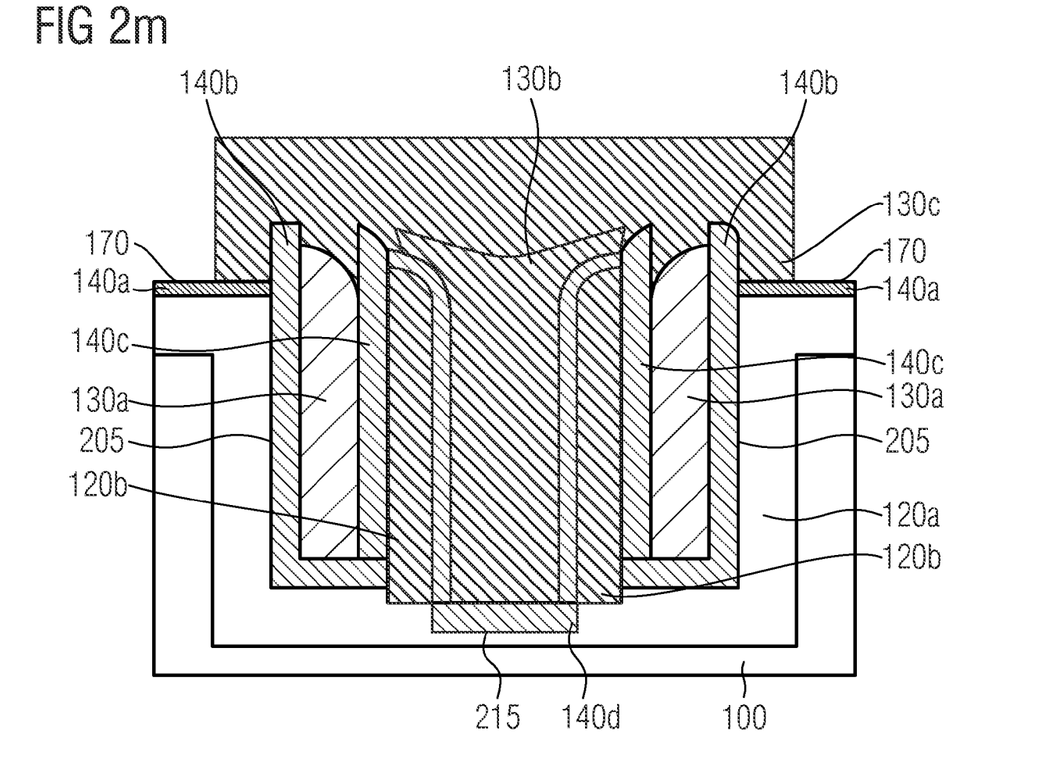

As illustrated in FIG. 2m, a third part of the second conductive structure 130c is applied to the structure illustrated in FIG. 2l. Thus, the first part of the second conductive structure 130a, the second part of the second conductive structure 130b and the third part of the second conductive structure 130c are electrically connected. The third part of the second conductive structure 130c can again include ISDP, for example.

Accordingly, the first conductive structure 120 is formed from the doping layer 120a and the conductive layer 120b, and the second conductive structure 130 includes the first, second, and third parts of the second conductive structure 130a, 130b, and 130c. The first conductive structure 120 and the second conductive structure 130 are electrically insulated by the dielectric layer 140. The dielectric layer 140 includes the first, second, third, and fourth parts of the dielectric layers 140a, 140b, 140c, and 140d.

As such, the structure obtained in FIG. 2m corresponds to the structure described in FIG. 1, except for the concrete shape of the layers. An electric contact can be set up via the first terminal contact 150 contacting the first conductive structure 120, and via the second terminal contact 160 contacting the second conductive structure 130.

The structure disposed in a meander-shaped manner of the dielectric layer 140 selected in this embodiment has a double multistack architecture. The meander-shaped design of the dielectric layer 140 becomes apparent in the multiple folding of this layer along the cross-section through the capacitor, as is apparent, for example, in FIG. 1. In the herein selected embodiment, two foldings appear within the recess 145 each insulating a part of the first conductive structure 120, namely both parts of the conductive layer 120b, from the second conductive structure 130. In further embodiments the process sequence can be continued to thus achieve further foldings.

While an embodiment of the present invention has been explained in detail above, it is apparent that the present invention is not limited to this embodiment. In particular, the present invention can also be applied to capacitor devices having a different arrangement of contact regions and/or a contacting via a buried conductor. Additionally, the number of foldings herein is only exemplarily chosen and can vary in further embodiments. Also the form of the recess 145 in a top view is not determined by the inventive concept. Likewise, the selected materials and layer thicknesses are only examples promising a good processability. In further embodiments, the parts of the dielectric layers 140a, 140b, 140c, and 140d, for instance, include different materials, wherein a material boundary, for example between the first and second parts of the dielectric layers 140a and 140b, runs self-adjustingly flush to and/or along the wall 205 of the recess 145.

Embodiments of the present invention include several advantages as compared to a conventional process control. The process control is self-adjusting (does not need additional photo planes) and can thus be realized even without high-resolution exposure (<i-line exposure). Thereby, the method becomes technologically controllable at small cost. With same geometry as in conventional trench capacitors, an increase of the area capacitance by a factor of 4 can be achieved, for example. Thus, by the self-adjustment of individual processes, a multiplication of the previous area capacitance can be achieved at low costs. The meander-shaped design of the layer structure offers the possibility to utilize an available volume in the substrate 100 optimally, and is therefore, compared to conventional methods, of considerable advantage in the continually proceeding miniaturization of integrated circuits.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a capacitor device in a trench in a substrate, comprising:
    forming a conductive structure along a trench bottom and a trench wall;
    at least one-time performing of the following sequence:
        depositing a first part of a dielectric layer in the trench;
        depositing a conductive material in the trench;
        removing the conductive material on the trench bottom by anisotropic etching;
        depositing a second part of the dielectric layer;
        removing dielectric on the trench bottom by anisotropic etching;
        depositing conductive material in the trench;
        removing the conductive material on the trench bottom by anisotropic etching;
        depositing a third part of the dielectric layer in the trench;
        depositing conductive material in the trench and electrically connecting the conductive material on a side of the dielectric layer facing away from the substrate to a second electrode structure, wherein the conductive material in the trench on a side of the dielectric layer facing the substrate and a conductive structure along the trench bottom and the trench wall form the first electrode structure.

2. The method according to claim 1, further including diffusing dopant atoms into the substrate so that the conductive structure is formed comprising a contact to the first electrode structure.

3. The method according to claim 1, wherein the step of electrically connecting the conductive material comprises:
    removing conductive material and removing dielectric by etching to expose conductive material that was covered by the removed dielectric in direction of etching, and applying conductive material to electrically connect the exposed conductive material.

4. The method according to claim 1, further comprising anisotropically etching the substrate to create the trench in the substrate.

5. The method according to claim 1, wherein depositing the first, the second or the third part of the dielectric includes a chemical vapor deposition method.

* * * * *